United States Patent

[11] 3,631,333

[72] Inventor Henri T. Pichal
St. Petersburg, Fla.
[21] Appl. No. 34,939
[22] Filed May 6, 1970
[45] Patented Dec. 28, 1971
[73] Assignee Honeywell, Inc.
Minneapolis, Minn.

[54] ELECTRICALLY CONTROLLED ATTENUATOR
23 Claims, 3 Drawing Figs.

[52] U.S. Cl. .......... 323/66, 323/87, 323/88, 333/81
[51] Int. Cl. .......... H01p 1/22, G05f 3/00
[50] Field of Search .......... 323/66, 87, 88; 333/81

[56] References Cited
UNITED STATES PATENTS

| | | | |
|---|---|---|---|
| 2,881,400 | 4/1959 | Rogers .......... | 333/81 |
| 3,150,326 | 9/1964 | Witt .......... | 333/81 X |
| 3,495,193 | 2/1970 | Harwood .......... | 333/81 |

*Primary Examiner*—Gerald Goldberg
*Attorney*—Ronald T. Reiling

ABSTRACT: In an electrically controlled attenuator input signals pass through two transformer windings of opposing phase the signals then pass to output terminals. A DC control voltage varies the current through a variable impedance diode in series with one of the windings. The currents through the windings ordinarily cancel because of their phase opposition. The variable impedance diode regulates the currents through one of the windings and therefore the degree of cancellation. This varies the attenuation.

INVENTOR.
HENRI T. PICHAL
BY Leo Stanger
ATTORNEY

ELECTRICALLY CONTROLLED ATTENUATOR

BACKGROUND OF THE INVENTION

This invention relates to attenuators that attenuate signals between an input and an output, and particularly to electronically variable attenuators that change the amplitude of a signal on the basis of an electronic input, for example, one that was established by an automatic gain control generator.

In the past, such signal control has been accomplished by so called variolossers. A variolosser constitutes a voltage divider formed from a resistor in series with a diode. The input signal appears across the series connected resistor and diode and the output signal appears across the diode. The direct current through the diode is varied by a variable voltage or current generator, such as an automatic gain control generator. The current thus varies the impedance of the diode. This change in impedance varies the proportion of the total input signal which appears across the diode, and hence varies the output signal. When the direct current through the diode is low its impedance is high and the proportion of the input signal appearing across the diode is also high. Thus, the variolosser exhibits a low attenuation. On the other hand, if the direct current input to the diode is high its impedance is low and the proportion of the total input voltage across the diode is also low. This results in a high attenuation.

One of the disadvantages of such variolossers lies in the large minimum attenuation exhibited by them. For example, where the load resistance at the voltage output is small and the generator resistance at the signal input is large, the typical minumum values of insertion loss are in the 10-decibel to 20-decibel range. Such variolossers also produce distortion of the input signals. This is so because the entire output signal appears across the diodes and the latter exhibit non linear characteristics. This distortion increases as the signal amplitudes are increased.

SUMMARY OF THE INVENTION

According to a feature of the invention these disadvantages are obviated by passing the signal through signal cancellation means for producing cancellation of the signals, and by controlling the degree of cancellation by means of a variolosser. More specifically, according to a feature of the invention, a first electrical means produces an electrical representation of the signal and a second electrical means produces a representation of the signal in phase opposition to the first electrical means so as to produce cancellation. Preferably, a variable impedance in the variolosser varies the amplitude of the electrical representation and one of the electrical means as compared to the other so as to vary the degree of cancellation.

According to another more specific feature of the invention, the electrical means each include an inductive winding coupled to the other and carrying a current corresponding to the signals to be attenuated.

According to another feature of the invention, the variable impedance means of the variolosser is connected to one of the inductive windings. This changes the current through one of the windings and varies the degree of cancellation.

According to still another specific feature of the invention, the two windings are connected to each other in series and coupled in phase opposition.

According to still another feature of the invention, the two windings that are series connected are accompanied by a third winding also series connected to the other two and in phase opposition to the one winding with which it is most immediately connected.

According to still another feature of the invention, the variable impedance means are connected to the junction of this third winding and one of the first two windings.

According to yet another feature of the invention, the two windings are connected in parallel and in phase opposition.

According to still another feature of the invention, a third winding is inductively coupled to the first two windings to sense the signal resulting from the cancellation.

According to yet another feature of the invention, the third winding comprises a pair of split windings connected in parallel.

According to still another feature of the invention all the windings are essentially identical.

Because of these features, only a small portion of the signals appear across the variable impedance, for example the diodes of the variolossers, and thereby distortion is minimized.

These and other features of the invention are pointed out in the claims. Other advantages and objects of the invention will become obvious from the following detained description when read in light of the accompanying drawings.

DESCRIPTION OF THE PREFERRED EMBODIMENTS

Figure 1:
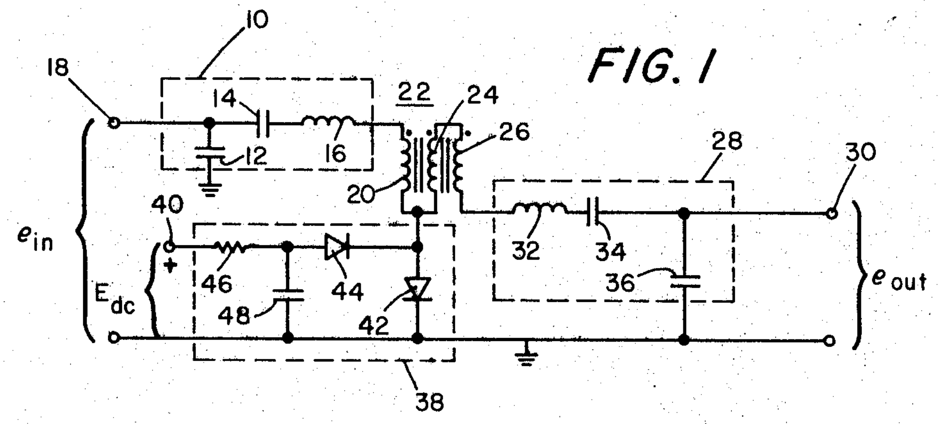
FIG. 1 is a schematic diagram of an attenuator embodying features of the invention.

In the attenuator of FIG. 1 an impedance matching circuit 10 composed of an input shunt capacitor 12, a series capacitor 14 and inductor 16, passes input signal $e_{in}$ from an input terminal 18 to an input winding 20 of a transformer 22. A secondary winding 24 and a tertiary winding 26 on the transformer 22 are series connected to each other and to the winding 20. They thus pass the input signal through an output impedance matching circuit 28 to an output terminal 30. The three windings 20, 24, and 26 are identical. A series inductor 32 and capacitor 34, and a shunt capacitor 36 form the matching circuit 28. The input signal $e_{in}$ may for example be an RF signal of 500 kHz.

The three successive serially connected windings 20, 24, and 26 are wound so they are inductively coupled in phase opposition. Thus, the voltages formed by the series signal current in the primary and secondary windings 20 and 24 tend to cancel or buck each other. Similarly, the voltages formed by the series signal current in the secondary winding 24 and tertiary winding 26 tend to cancel or buck each other. The dots at the winding indicate that the polarity of the induced voltages in these windings is the same at any one instant. Thus, if the polarity of the induced voltage at the dotted end of one winding is positive, the polarities of the induced voltages at the dotted ends of the other windings are also positive. Therefore, the negative end of winding 20 is connected to the end of winding 24 which exhibits an induced negative potential. The induced positive end of the winding 24 connects to the end of winding 26 exhibiting a positive potential. The windings are thus connected sequentially negative to negative and positive to positive.

An impedance control circuit 38 controls the degree of voltage cancellation in the windings 20, 24, and 26. The circuit 38 corresponds to the conventional variolosser. Here a direct-current control voltage $E_{dc}$ at a terminal 40 varies the dynamic or signal impedance of two diodes 42 and 44 (which may be PN-junction type) on the basis of the forward direct control current it passes through the diodes 42 and 44. The forward control current also passes through a resistor 46. A shunt capacitor 48 bypasses signal frequencies. Thus, from the view point of signal frequencies, the capacitor 48 shunts the diode 44 across the diode 42 to form a diode pair 42, 44. The lower the direct control current through the diodes 42 and 44 the higher the combined-shunt signal or dynamic impedance of the diode pair 42, 44 to currents of signal frequency. The higher the current through the diodes 42 and 44 the lower their dynamic signal impedance. The voltage $E_{dc}$ producing the control current may be generated by an automatic gain control, or AGC, generator that corresponds to the signals $e_{out}$. Such a generator then makes the attenuator of FIG. 1 an automatic gain control system. The term impedance, signal impedance, or dynamic impedance as used herein with respect to the diodes 42 and 44 or diode pair 42, 44 represents their combined impedance in equivalent shunt connection to signal frequencies.

When the voltage $E_{dc}$ varies the current through, and hence the impedance of the diode pair 42, 44, it also varies the degree of voltage cancellation in the windings 20, 24, and 26. When the voltage $E_{dc}$ is low, the diode pair impedance is high. Thus, the degree of cancellation is small. This can be seen by considering the signal impedance of the diode pair as infinite. This is comparable to an open circuit between ground and the undotted ends of windings 20 and 24. Under these circumstances the induced voltages coupled in the windings 20, 24, and 26 by the signal passing through the windings from terminal 18 to terminal 30 constitute three series connected voltages. Because of the winding phases indicated by the dots, the first series-connected induced voltage $e_{i1}$ in the winding 20 is opposite in polarity to the series connected voltage $e_{i2}$ induced in winding 24. This $e_{i2}$ is in turn opposite to the series connected voltage $e_{i3}$ induced in the winding 26. Since the windings 20, 24, and 26 are identical except for phase, the voltages $e_{i1}$, $e_{i2}$, and $e_{i3}$ are also identical except for polarity. Thus, the resulting polarity of these opposing-polarity voltages is $e_i - e_i + e_i$, or $e_i$. The latter corresponds to the self induced voltage in a single winding. Hence, the combined impedance of the windings 20, 24, and 26 corresponds to that of the inductance $Lw$ of one of the windings. This results in minimum cancellation.

When the voltage $E_{dc}$ is up and the signal impedance of diode pair 42, 44 is small, cancellation is great. This reduces the output signal voltage $e_{out}$ at terminal 30. The latter effect can be seen from considering the diode pair 42, 44 as exhibiting an impedance of zero. The undotted ends of windings 20 and 24 are then connected directly to ground. This removes the induced voltage in winding 20 from the series connection. Only the equal induced voltages in windings 24 and 26 remain in series. These voltages are opposing and cancel.

Intermediate values of $E_{dc}$ produce intermediate values of signal impedance in the diode pair 42, 44 and hence intermediate degrees of cancellation. This furnishes intermediate attenuation of the signal voltage $e_{in}$ at the output voltage $e_{out}$.

An example of the values which may be used for the elements in the attenuator of FIG. 1 appear in the following table. These of course are examples only and should not be taken as limiting.

| | |
|---|---|
| capacitor 12 | 0.0068 $\mu f$ |
| capacitor 14 | 0.1 $\mu f$ |
| inductor 16 | 10 $\mu h$ |
| inductor 32 | 10 $\mu h$ |
| capacitor 34 | 0.1 $\mu f$ |
| capacitor 36 | 0.0068 $\mu f$ |
| resistor 46 | 1000 Ω |
| Transformer | 8.5 $t$ on a T25-12 Form. |

Figure 2:
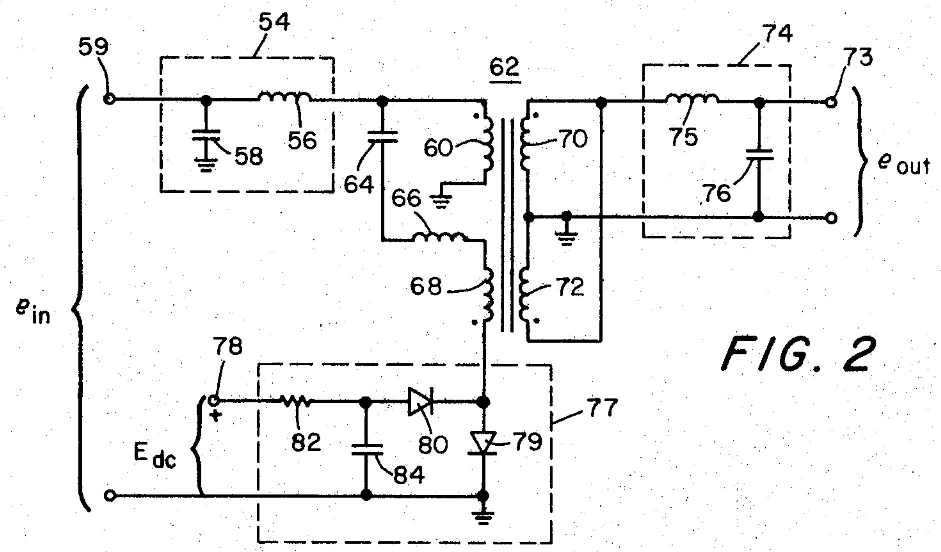
FIG. 2 is a schematic diagram of another attenuator embodying features of the invention.

The invention may also be embodied with parallel-connected windings as shown in FIG. 2. Here an impedance matching circuit 54 composed of an inductor 56 and capacitor 58 passes an input signal $e_{in}$, e.g. 500 kHz. from a terminal 59 to a winding 60 of a transformer 62. A series circuit composed of inductor 64 and capacitor 66 passes the same input signal $e_{in}$ to a second identical winding 68 on the transformer 62. The inductor 64 and capacitor 66 merely tune out extraneous lead inductances in the windings and diode. They have substantially no effect on the main operation of this attenuator.

Two windings 70 and 72, identical to windings 60 and 68 transmit the signal, as affected by transformer 62 to an output terminal 73 through an impedance matching circuit 74. The latter is composed of an inductor 75 and a capacitor 76.

The windings 70 and 72 are combined in parallel to behave as a single winding. The phases at the windings 60, 68, 70, and 72 are shown by the dots. Each dot indicates that at any moment the polarities at that winding end corresponds to the polarity at the dotted ends of the other windings. As can be seen the windings are such as to tend to cancel signals in windings 60 and 68. Thus, when they cancel signals to some degree, the signal coming out of windings 70 and 72 is attenuated.

The degree to which the signal is cancelled and hence attenuated is determined by an impedance control circuit 77 comparable to that of the control circuit 38 in FIG. 1. This determines the degree of voltage cancellation in the windings 60 and 68. The circuit 77 again corresponds to the conventional variolosser. Here again a direct current control voltage $E_{dc}$ at a terminal 78 varies the signal impedance of two diodes 79 and 80 on the basis of the direct control current that passes through them. This control current also passes through a resistor 82. A shunt capacitor 84 bypasses currents of signal frequency. Thus, insofar as signal frequencies are concerned, capacitor 84 shunts the diode 80 across the diode 79 to form a diode pair 79, 80.

As in FIG. 1 the lower the control current through the diodes 79 and 80 the higher signal impedance of the shunted diode pair 79, 80 to alternating signals. The higher the current through the diodes 79, 80 the lower the impedance of the diode pair. As in FIG. 1 the voltage $E_{dc}$ producing the control current may be generated by an automatic gain control, or AGC, generator that responds to the signals $e_{out}$. This then makes the attenuator of FIG. 2 an automatic gain control system.

When the voltage $E_{dc}$ varies the direct current through and hence the signal impedance of the diode pair 79, 80 it varies the amount of signal current flowing through the winding 68. The circuit composed of capacitor 62 and inductor 64 improve the operation by turning out inductive losses in the leads.

When the signal current in the winding 68 equals the signal current in the winding 60, these two signal currents cancel in the transformer 62 so that at the windings 70 and 72 there is substantially no output voltage. On the other hand, if there is no signal current in the winding 68 the entire signal current in the winding 60 appears across the windings 70 and 72.

Thus, when the voltage $E_{dc}$ is small, the signal impedance of the diode pair 79, 80 is high, and the degree of cancellation in the windings 60 and 68 is small. The degree of cancellation is small because substantially no signal current passes through the winding 68. This can be seen by considering the impedance of diode pair 79, 80 as infinite. This is comparable to an open circuit between ground and the dotted end of the winding 68.

When the voltage $E_{dc}$ is large the impedance of diode pair 79, 80 is small, and cancellation is great. This is so because in the extreme the winding 68 can be considered as being connected at its dotted end to ground. Under those circumstances, the current passing through the winding 68 is substantially equal to current passing through the winding 60 and because the windings are inductively coupled in phase opposition these currents cancel. The output at the windings 70 and 72 are therefore substantially inhibited. Intermediate values of voltage $E_{dc}$ produce intermediate values of dynamic impedance in diode pair 79, 80 and hence intermediate degrees of cancellation. This furnishes intermediate attenuation of the signal voltage $e_{in}$ at the output voltage $e_{out}$.

Figure 3:
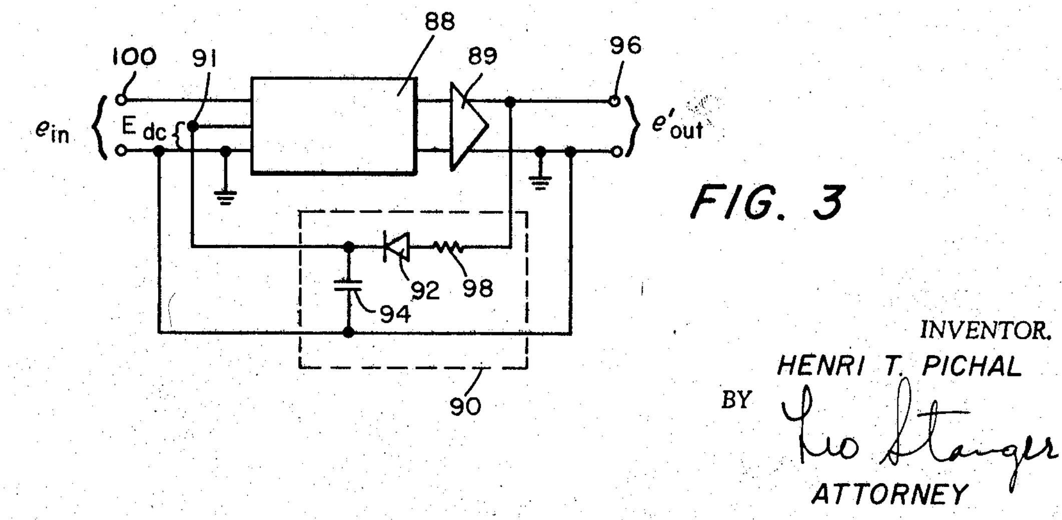
FIG. 3 is a diagram of an automatic gain control system utilizing the attenuators of FIGS. 1 and 2 and embodying features of the invention.

FIG. 3 illustrates an automatic gain control, AGC, system utilizing an attenuator 88 which includes an attenuator corresponding to that of either FIG. 1 or FIG. 2. An amplifier 89 adds gain to the attenuator output. A gain control generator 90 is composed of a detecting diode 92 and a filter capacitor 94. The automatic gain control generator 90 furnishes the control signal to a terminal 91 corresponding to the terminals 40 and 78 in FIGS. 1 and 2 respectively. This corresponds to the control voltage $E_{dc}$ The automatic gain control generator receives signals $e'_{out}$ from a terminal 96. Except for the amplification of amplifier 89, the signal $e'_{out}$ corresponds to $e_{out}$, and terminal 96 corresponds to the terminals 30 and 73 in FIGS. 1 and 2. A limiting resistor 98 controls the degree of feedback established by the automatic gain control generator 90.

In operation the input signal $e_{in}$ is applied to a terminal 100. The automatic gain control generator 90 takes the output signal $e_{out}$ filters it and establishes a DC voltage at the terminal 91.

The attenuator 88, which operates as do the attenuators in FIGS. 1 and 2, varies the output signal $e_{out}$ on the basis of the voltage generated by the generator 90. If the output signal $e_{out}$ is too high, the generator 90 produces a high DC signal that causes the attenuator 88 to increase the cancellation in its corresponding windings and therefore reduce the voltage output $e_{out}$.

An automatic gain control system such as that of FIG. 3, employing the electronic attenuator of FIGS. 1 and 2, tends to keep the signal output level nearly constant at the output terminals 30 and 73. Therefore, as the signal level at the input terminal is increased the DC bias established by automatic gain control, AGC, generator increases. This in turn causes the dynamic resistance presented by the shunted diode pairs 42, 44 and 79, 80 to be reduced in order to establish the degree of signal cancellation necessary for nearly a constant signal output.

As the AGC system of FIG. 3 utilizes the attenuator of FIG. 1 or FIG. 2, the cancellation causes a high signal level to decrease the impedances of diode pairs 42, 44 or 79, 80. This reduces the proportion of the input signal across the diode pairs as the input signal levels increase. Thus, the tendency of the nonlinear diode pairs to impose greater and greater distortions on larger and larger signals is reversed. This reduces the effect of distortion by the diodes upon the signals.

In all of the figures, any distortion components that result from finite signals across diode pairs 42, 44 or 78, 80 are coupled across windings 24 or 68. However, the windings 24 and 26, and 68 and 70 respectively are in phase opposition. Hence, the residual distortion at the diodes is subject to the cancellation process of the transformer 22 or 62. This further reduces the distortion product resulting across the signal output windings 70 and 72.

The combination of the inverse signal ratio function at the diodes and the effective cancellation of the small remaining distortion products in the transformer provide a substantially distortion free electronic attenuator.

The intrinsic insertion loss is quite small and is essentially only associated with the losses in the transformer itself. Typical values of minimum attenuation that may be achieved are as low as in the 0.1 to 0.3 db. range. Maximum ranges of attenuation of 100 db. have been achieved.

While embodiments of the invention have been described in detail it will be obvious to those skilled in the art that the invention may be embodied otherwise within its spirit and scope.

What is claimed is:

1. An attenuator comprising input circuit means, output circuit means, inductive coupling means for coupling an AC signal from said input means to said output means, at least two series connected signal cancellation means coupled in series with said coupling means for producing two electrical representations of the signals in phase opposition and so as to produce cancellation of the signal, and DC forward biased diode-pair variable impedance means coupled to each other in series configuration relative to the DC signal and in parallel complementary configuration relative to the AC signal, said diode-pair variable impedance means coupled to said cancellation means at said cancellation means series junction point for varying the degree of cancellation in said cancellation means.

2. An attenuator as in claim wherein said variable impedance means includes a variable impedance device connected to at least one of said inductive means for varying the impedance in series with said inductive means.

3. An attenuator as in claim 1 wherein said cancellation means includes a plurality of current-carrying means coupled to each other in signal phase opposition.

4. An attenuator as in claim 3 wherein conductive means connect one of said current-carrying means to said variable impedance means so that said variable impedance means varies the amplitude of the phase opposing currents in said current-carrying means.

5. An attenuator as in claim 4 wherein each of said current-carrying means include inductors.

6. An attenuator as in claim 5 wherein said inductors are coupled to each other in phase opposition.

7. An attenuator as in claim 6 wherein said inductors are series connected in phase opposition.

8. An attenuator as in claim 6 wherein said coupling means has an additional inductor coupled to said phase opposed inductors and one of said phase-opposed inductors and said additional inductor are connected to said variable impedance means.

9. An attenuator as in claim 8 wherein said additional inductor connected to said variable impedance means is connected by said impedance means across said input circuit.

10. An attenuator as in claim 6 wherein one of said inductors are parallel connected.

11. An attenuator as in claim 6 wherein one of said inductors is series connected to said variable impedance means.

12. An attenuator as in claim 11 wherein said coupling means include an additional inductor coupled to said phase-opposed inductors and connected to said output circuit means.

13. An attenuator as in claim 1 wherein said variable impedance means includes a diode and control means connected to said diode for varying direct current therethrough.

14. An attenuator comprising:

a. input circuit means for impressing an AC signal on said attenuator;

b. output circuit means for abstracting an AC signal from said attenuator;

c. signal cancellation means coupled to said input and output means further comprising, a transformer having at least three series-connected windings connected sequentially a negative to a negative terminal, and a positive to a positive terminal;

d. and DC biased diode-pair variable impedance means coupled to each other in series configuration relative to the DC signal and in parallel complementary configuration relative to the AC signal, said diode-pair variable impedance means coupled to said signal cancellation means for varying the degree of cancellation in said cancellation means.

15. An attenuator as recited in claim 14 including input impedance matching means coupled between said input means and said signal cancellation means and output impedance matching means coupled between said output means and said cancellation means for matching the impedance of said input means and output means to said cancellation means.

16. An attenuator as recited in claim 15 wherein said input and output matching means comprise a first capacitor coupled in parallel to a series-connected second capacitor and inductor.

17. An attenuator as recited in claim 14 wherein the combined impedance of said windings corresponds to that of the inductance to one of the windings.

18. An attenuator as recited in claim 17 wherein said diode means are directly coupled to said primary and secondary windings at their junction.

19. An attenuator as recited in claim 17 wherein the signal to be controlled is applied to the primary winding, and wherein the impedance of the diode means is varied to vary the inductance of said primary winding thus varying the self-induced voltage of said primary winding, and wherein the induced voltage of said secondary is cancelled by the opposite substantially equal induced voltage of said tertiary winding.

20. An attenuator as recited in claim 14 wherein said windings are individually wound independently one from the other.

21. An attenuator as recited in claim 14 wherein said diode pair variable impedance means are coupled cathode to anode.

22. An attenuator comprising:

a. input circuit means for comprising an AC signal on said attenuator;

b. output circuit means for abstracting an AC signal from said attenuator;

c. inductive coupling means for coupling the signal from said input means to said output means;

d. input-impedance-matching means coupled between said input means and said inductive coupling means for matching the impedance of said input means to that of said coupling means, said input-impedance-matching means further comprising a first capacitor in parallel with a first inductor;

e. output-impedance-matching means coupled between said output means and said inductive coupling means for matching the impedance of said output means to that of said coupling means, said output-matching means further comprising a second capacitor in parallel with a second inductor;

f. at least two parallel connected signal cancellation means coupled in parallel to said inductive coupling means for producing two electrical representations of the signal in phase opposition and so as to produce cancellation of the signal;

g. and diode-pair variable impedance means coupled cathode to anode, and further parallel coupled to said parallel connected signal cancellation means for varying the degree of cancellations in said cancellation means.

23. An attenuator as recited in claim 22 wherein said diode pair variable impedance means comprise a first resistor in parallel with a first diode, a third capacitor in parallel with said first resistor and first diode, and a second diode in parallel with said first diode.

* * * * *